United States Patent [19]
Darmawan

[11] Patent Number: 4,853,344
[45] Date of Patent: Aug. 1, 1989

[54] METHOD OF FORMING ISOLATION REGION IN INTEGRATED CIRCUIT STRUCTURE BY FORMING ISOLATION SLOT, OXIDIZING WALLS OF ISOLATION SLOT, GROWING EPITAXIAL LAYER OVER ISOLATION SLOT, AND THEN LOCALLY OXIDIZING EPITAXIAL LAYER OVER ISOLATION SLOT UNTIL OXIDE GROWN

[75] Inventor: Johan A. Darmawan, San Antonio, Tex.

[73] Assignee: Advanced Micro Devices, Inc., Sunnyvale, Calif.

[21] Appl. No.: 231,452

[22] Filed: Aug. 12, 1988

[51] Int. Cl.$^4$ ............................................. H01L 21/76
[52] U.S. Cl. ........................................ 437/38; 437/67; 437/72
[58] Field of Search ..................... 437/67, 69, 72, 38

[56] References Cited

U.S. PATENT DOCUMENTS

| 4,256,514 | 3/1981 | Pogge | 156/643 |
| 4,381,956 | 5/1983 | Lane | 437/72 |
| 4,473,598 | 9/1984 | Ephrath et al. | 437/67 |
| 4,528,047 | 7/1985 | Beyer et al. | 156/648 |
| 4,554,728 | 11/1985 | Shepard | 437/67 |
| 4,639,288 | 1/1987 | Price et al. | 156/643 |

FOREIGN PATENT DOCUMENTS

| 56-137648 | 10/1981 | Japan | 437/69 |
| 57-196544 | 12/1982 | Japan | 437/72 |
| 58-140137 | 8/1983 | Japan | 437/67 |
| 60-105247 | 6/1985 | Japan | 437/72 |
| 61-135136 | 6/1986 | Japan | 437/72 |

Primary Examiner—Olik Chaudhuri
Attorney, Agent, or Firm—John P. Taylor

[57] ABSTRACT

A process is disclosed for forming an isolation region in a substrate of an integrated circuit structure while minimizing the creation of stress in the substrate which comprises forming a first mask over a portion of the substrate where an isolation region is to be formed, forming an isolation slot in the substrate through an opening in the mask, oxidizing the walls of said isolation slot, removing the first mask, growing an epitaxial layer over the substrate which fills or covers the remainder of the isolation slot, forming a second mask over the epitaxial layer with an oversize opening therein over the isolation slot beneath the epitaxial layer, and oxidizing the exposed portion of the epitaxial layer through the opening in the second mask to form an oxide cap over the isolation slot which extends downwardly through the epitaxial layer to the oxide in the isolation slot.

21 Claims, 3 Drawing Sheets

METHOD OF INTEGRATED CIRCUIT ISOLATION OXIDIZING WALLS OF ISOLATION SLOT, GROWING EXPITAXIAL LAYER OVER ISOLATION SLOT, AND OXIDIZING EPITAXIAL LAYER OVER ISOLATION SLOT

BACKGROUND OF THE INVENTION

1. Field of the Invention

This invention relates to the formation of an isolation region in the substrate of an integrated circuit structure. More particularly, this invention relates to a method for forming such an isolation region in which a layer of epitaxially grown material is formed over an isolation slot formed in the substrate of an integrated circuit structure, thereby eliminating the need for a separate step to refill the slot after the slot walls have been oxidized.

2. Description of the Related Art

In the construction of integrated circuit structures, isolation regions are formed to electrically isolate and insulate adjacent active devices, or components, from one another. One such method for forming such isolation regions involves the formation of a slot or groove in a substrate. The walls of this slot or groove are then oxidized, to form the desired isolation or insulation, followed by refilling of the slot, usually with oxide or polysilicon. The surface of the structure is then planarized using wet or dry etching techniques and/or mechanical polishing.

While such methods do result in the formation of isolation regions which effectively insulate/ isolate active devices and components from one another, damage to the substrate can occur during the processing steps used in forming the isolation region.

For example, damage to the substrate may occur due to stresses formed by excessive oxide growth in the slot. The substrate may also be stressed by void formation during refilling with polysilicon as a result of opening the void during subsequent planarization followed by oxidation of the sidewalls of the void. Formation of an oxide cap on the slot, in a manner wherein the oxide grows down into the slot, can also create stress. Mechanical polishing of the structure during planarization after refill may break the wafers, or leave refill material on the backside of the wafers which may also warp the wafers.

It would, therefore, be desirable to provide a method for forming an isolation region in the substrate of an integrated circuit structure while inhibiting or eliminating the formation of damaging stresses in the crystal structure of the substrate during such processing.

SUMMARY OF THE INVENTION

It is, therefore, an object of this invention to provide a method for forming an isolation region in the substrate of an integrated circuit structure which includes forming a layer of epitaxially grown material over an isolation slot formed in the substrate.

It is another object of this invention to provide a method for forming an isolation region in the substrate of an integrated circuit structure wherein an epitaxial layer is grown over an isolation slot formed in the substrate and lined with oxide prior to the growth of the epitaxial layer.

It is yet another object of this invention to provide a method for forming an isolation region in the substrate of an integrated circuit structure wherein an epitaxial layer is grown over an isolation slot formed in the substrate and lined with oxide prior to the growth of the epitaxial layer which fills the isolation slot.

It is still another object of this invention to provide a method for forming an isolation region in the substrate of an integrated circuit structure wherein an epitaxial layer is grown over an isolation slot formed in the substrate and lined with oxide prior to the growth of the epitaxial layer which covers the isolation slot.

It is a further object of this invention to provide a method for forming an isolation region in the substrate of an integrated circuit structure wherein an epitaxial layer is grown over an isolation slot formed in the substrate and lined with oxide prior to the growth of the epitaxial layer and the epitaxial layer is then oxidized down to the level of the substrate in the region where the isolation slot is formed.

It is yet a further object of this invention to provide a method for forming an isolation region in the substrate of an integrated circuit structure wherein an epitaxial layer is grown over an isolation slot formed in the substrate and lined with oxide prior to the growth of the epitaxial layer and the epitaxial layer is then selectively etched to thin the layer in the region where the isolation slot is formed followed by selective oxidation of the thinned portion of the layer down to the level of the substrate so that the oxide formed by oxidation of the thinned epitaxial layer is contiguous with the oxide on the sidewalls of the isolation slot.

These and other objects of the invention will be apparent from the following description and accompanying drawings.

DETAILED DESCRIPTION OF THE INVENTION

The invention provides an improved method for forming an isolation region in the substrate of an integrated circuit structure wherein an isolation slot, formed in a substrate and lined with oxide to provide the desired isolation/insulation between active devices or components in the structure, is either filled or covered by growing an epitaxial layer over the structure. The epitaxial layer is then patterned and the portion of the layer over the isolation slot is then oxidized to provide an oxide cap over the slot without extending the oxide growth into the slot to thereby avoid creating stresses in the substrate. In one embodiment, the portion of the epitaxial layer overlying the isolation slot is first thinned prior to oxidation thereof to facilitate oxidizing the remaining portions of the thinned epitaxial layer down to the level of the oxidized sidewalls of the isolation slot.

The following description and reference to the accompanying drawings will serve to show the practice of the invention referring to a silicon substrate and the growth of a silicon epitaxial layer by way of illustration and not of limitation.

Figure 1:
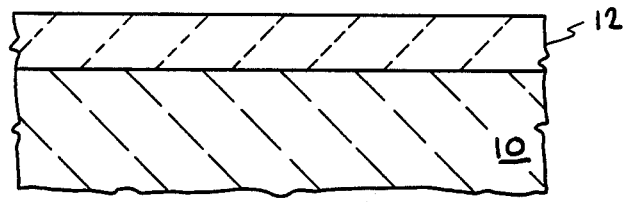
FIG. 1 is a fragmentary vertical cross-section view of a substrate showing formation of a buried layer therein prior to formation of the isolation slot of the invention.

Turning now to FIG. 1, a silicon substrate 10 is shown with an optional buried layer 12 formed thereon which may serve as the buried collector layer of a bipolar device. Such a buried layer may be formed by initially masking substrate 10 to only expose portions of the substrate to be doped to form buried layer 12. Since the formation of such a buried layer is only optional and forms no part of the present invention, the remaining figures will denote the substrate and any buried layer formed therein collectively by the numeral 10.

After formation of optional buried layer 12 in substrate 10, the substrate is prepared for formation of an isolation slot or region by first cleaning the substrate surface, e.g., with a 10:1 water/ HF solution, and then growing or depositing, over substrate 10, a thin oxide layer 20 having a thickness of approximately 350–600 Angstroms (Å) to provide a compatible interface between the surface of silicon substrate 10 and a nitride masking layer to be applied.

A nitride layer 30 is then deposited over oxide layer 20 to a thickness of from about 1000 to about 1500 Å, preferably about 1200 Å, and a layer 40 of glass, e.g., silicon oxide, is then deposited to a thickness of from about 1 to 1.5 microns (10–15KÅ). Glass layer 40 may be undoped or may be doped with from about 4–6 wt.% phosphorus, for purposes of convenience if a later phosphorus-doped topside (passivation) glass layer is used over the finished structure (since the same apparatus may then be used to form both layers).

Figure 2:
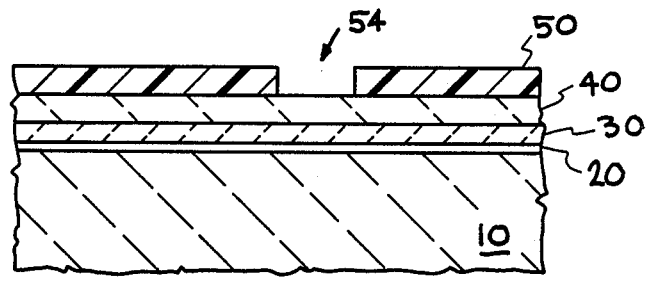
FIG. 2 is a fragmentary vertical cross-section view of the substrate of FIG. 1 showing formation of oxide and nitride masking layers thereon with a patterned photoresist applied over the masking layers.

A photoresist mask 50 is then applied over the structure and patterned to form an opening 54, as shown in FIG. 2, conforming to the desired width of the isolation slot to be formed in substrate 10.

Figure 3:
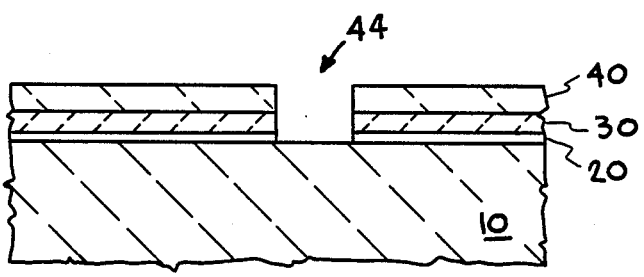
FIG. 3 is a fragmentary vertical cross-section view showing the masking layers of FIG. 2 after etching through the photoresist pattern and removal of the resist layer.

Glass layer 40, nitride layer 30, and oxide layer 20 are then etched through mask opening 54 in resist mask layer 50 using plasma or RIE etching to form opening 44. Resist layer 50 is normally then removed prior to etching the isolation slot in silicon substrate 10, to prevent formation of carbon deposits in the slot during the silicon slot etch, leaving the oxide/nitride/oxide slot mask formed from layers 20, 30, and 40 as shown in FIG. 3.

Figure 4:
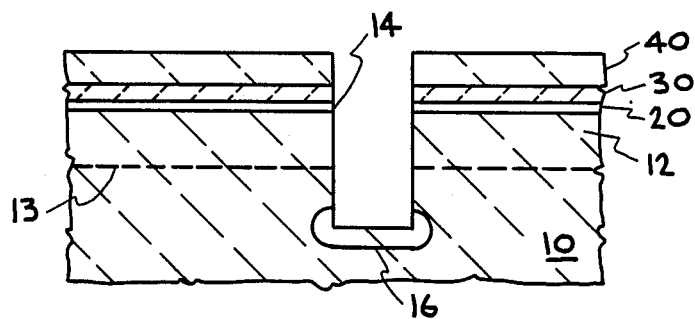
FIG. 4 is a fragmentary vertical cross-section view of the structure of FIG. 3 showing etching of the substrate through the masking layers to form the isolation slot in the substrate and formation of a channel stop region in the substrate beneath the slot.

Slot 14 is then etched in substrate 10 through the mask opening in layers 20, 30, and 40 to a depth which may be from about 4 to about 7 microns for a bipolar devices or as little as 1 micron for MOS devices using, for example, a RIE etching system to etch the silicon as shown in FIG. 4. It will be noted that the lower level of optional buried layer 12 is shown by a dotted line 13 in FIG. 4 to illustrate that to achieve the desired isolation, the depth of slot 14 should exceed the thickness of any buried layer previously formed in substrate 10.

Still referring to FIG. 4, after formation of slot 14, a slot channel stop region 16 may be implanted into substrate 10 at the bottom of slot 14 by implantation of, for example, boron at an energy level of, for example, about 60 kEV for a P-type substrate, or phosphorus at a similarly appropriate energy level for an N-type substrate, through the slot mask opening in layers 20, 30, and 40 to prevent any possibilities of inversion in the substrate during operation of active devices subsequently formed thereon.

After formation of slot 14 and implantation of channel stop region 16, glass layer 40 and any oxide in slot 14 may be removed using a hydrogen fluoride etchant solution, stopping on the underlying nitride mask layer 30.

Damaged silicon, in the substrate walls of slot 14, may then be removed using a silicon etch solution such as a mixture of $CrO_3$+HF or $NH_4OH$ +$H_2O_2$. It should be noted that this step may be carried out, if desired, prior to implantation of channel stop region 16 in substrate 10 at the bottom of slot 14.

Figure 5:
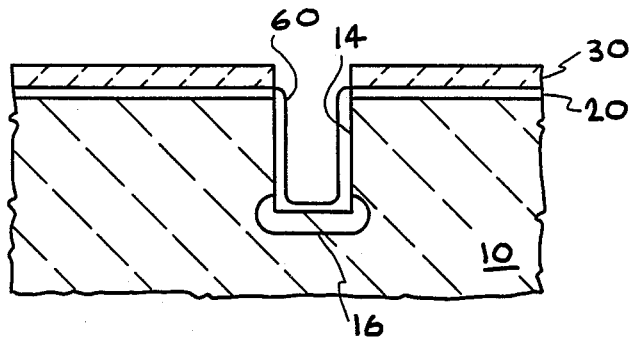
FIG. 5 is a fragmentary vertical cross-section view of the structure of FIG. 4 showing oxidation of the substrate walls of the slot formed therein.

After removal of glass or oxide layer 40 and removal of damaged silicon from the walls of slot 14, the exposed silicon walls of slot 14 are oxidized to provide an oxide layer or coating 60 of from about 2000 to about 3000 Å as shown in FIG. 5.

Oxide coating 60 may be formed by CVD, but preferably is grown by exposing the structure to a steam atmosphere for about 10 minutes at a temperature of from about 1000 to about 1100° C.

Figure 6:
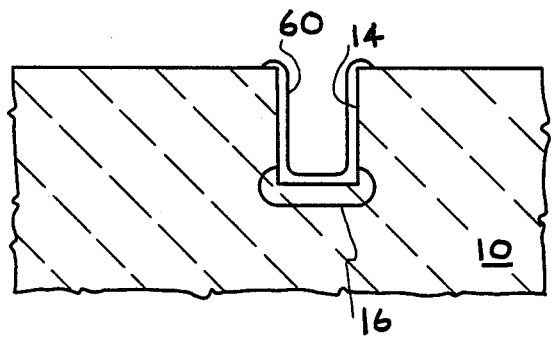
FIG. 6 is a fragmentary vertical cross-section view showing the structure of FIG. 5 after removal of the masking layers.

After forming oxide coating 60 on the walls of slot 14, the structure is subjected to a brief, i.e., 10–15 second, wet etch, such as 10:1 HF, or its derivative, ammonium fluoride +HF, to remove any oxide remaining on nitride layer 30 followed by a phosphoric acid etch to remove nitride layer 40, and a further oxide removal etch to remove oxide layer 20 beneath nitride layer 30, resulting in the structure shown in FIG. 6. It should be noted that the amount or thickness of oxide coating 60 is predetermined or preselected to be sufficient to provide for the removal or loss of some oxide during the etching steps to remove the nitride and oxide slot mask layers remaining on the structure, while leaving a sufficient amount to provide the desired isolation or insulation, i.e., at least around 800 Å.

Figure 7A:
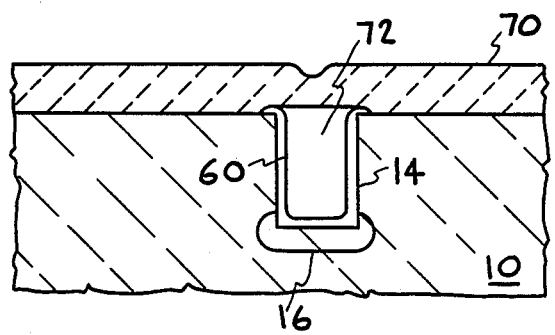
FIG. 7A is a fragmentary vertical cross-section view of another embodiment of the invention wherein the epitaxial layer grown over the isolation slot bridges across the slot without filling the slot with epitaxial material.
Figure 7:
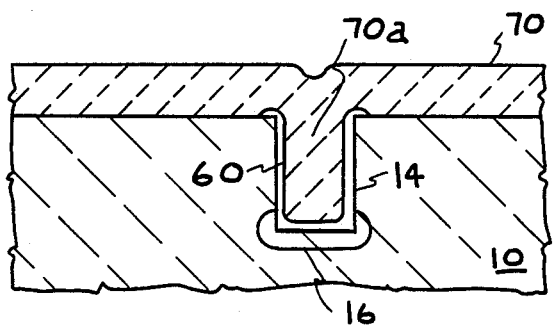
FIG. 7 is a fragmentary vertical cross-section view of one embodiment of the invention which shows the growth of an epitaxial layer over the structure of FIG. 6 which fills up the isolation slot.

In accordance with the invention, a layer 70 of epitaxial silicon is now grown over the silicon substrate 5 after removal of oxide layer 20, which, in the embodiment shown in FIG. 7, also fills slot 14 at 70a. Epitaxial silicon layer 70 is grown over substrate 10 to a depth or thickness of from about 1 to 2 microns, depending upon the width of slot 14 as well as the desired thickness of epitaxial layer 70 over those regions of the substrate where active devices will eventually be constructed.

As shown in the alternate embodiment depicted in FIG. 7A, it is also possible to alter the epitaxial growth process to bridge over slot 14 without filling the slot with silicon (polysilcon) leaving an empty volume 72 as shown in FIG. 7A. This may be accomplished by lowering the deposition pressure down to from about 150 to about 175 Torrs and the temperature down to from about 900° C. to about 1000° C. when the slot is about 1.4 microns or less in width.

It should be noted that epitaxial layer 70 is preferably doped by including a doping agent such as arsenic, for N-type epitaxial silicon, or boron, for P-type epitaxial silicon, in the silane gas used for such epitaxial growth. If it is considered not desirable to fill slot 14 with such doped epitaxial silicon, the epitaxial growth optionally may be divided into two steps or stages with about 0.3 to 0.5 microns of undoped epitaxial silicon first grown, followed by the remainder of the epitaxial silicon grown in the presence of the dopant.

Filling of slot 14 with silicon during the step of growing epitaxial silicon layer 70 (rather than filling the slot with oxide or polysilicon in a separate step as practiced by the prior art) by first constructing the slot and then growing the epitaxial layer, (instead of first growing the epitaxial layer and then forming the slot as also practiced by the prior art) eliminates the need for further steps to refill the slot and also eliminates the need to planarize such other fillers down to the level of the epitaxial layer, resulting in a simpler and lower cost process with higher yields.

Figure 8:
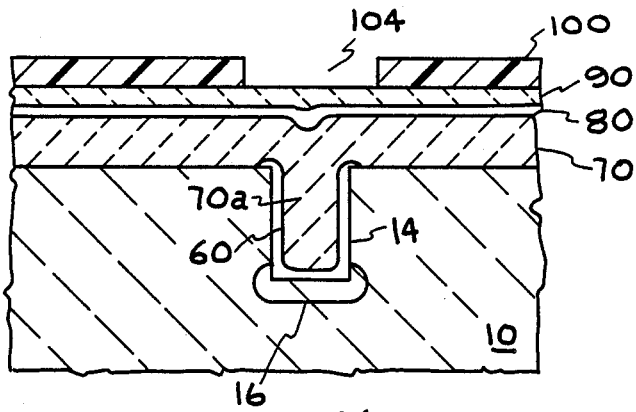
FIG. 8 is a fragmentary vertical cross-section view showing oxide and nitride masking layers formed over the epitaxial layer of FIG. 7 with a patterned photoresist layer applied over the masking layers.

After growth of epitaxial silicon layer 70, the entire surface of epitaxial layer 70 may be oxidized to form an oxide mask layer 80 which provides a compatible surface on which a nitride mask layer 90 may be applied. A photoresist mask layer 100 may then be applied having an oversized opening 104 therein which generally defines an area of substrate 10 which will not be used for the construction of active devices and which will, preferably, completely cover the area defined by slot 14, including the oxide coating 60 on the walls of slot 14, and also overlap a portion of substrate 10 around slot 14 as well, as illustrated in FIG. 8.

Figure 9:
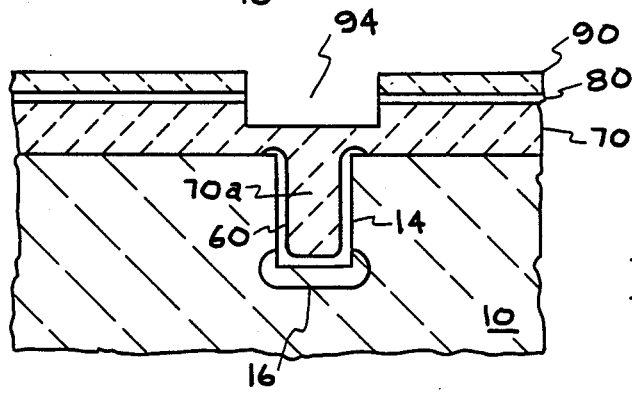
FIG. 9 is a fragmentary vertical cross-section view of the structure of FIG. 8 showing an opening formed in the masking layers over the portion of the epitaxial layer overlying the isolation slot with a portion of the epitaxial layer removed to locally thin the epitaxial layer over the isolation slot.

Turning now to FIG. 9, the portions of nitride layer 90 and oxide layer 80 exposed by opening 104 in resist mask 100 are then removed by suitable wet or dry etching techniques, forming opening 94 which exposes the underlying surface of epitaxial silicon layer 70.

At this point, the exposed area of epitaxial silicon layer 70 is preferably etched to thin the thickness down so that it can be completely oxidized down to the underlying isolation slot. As shown in FIG. 9, the amount of epitaxial silicon removed should be a sufficient amount of the original thickness of the epitaxial silicon layer so that subsequent oxidation of the remaining epitaxial silicon will result in a complete filling with oxide of the opening created by removal of the epitaxial silicon. This oxide filling will occur since oxidation results in upward as well as downward growth of the oxide because silicon oxide occupies a larger volume than the silicon from which it is formed by the oxidation.

The amount of epitaxial silicon removed by such a thinning step will also vary with the original thickness of the epitaxial layer. For example, if a 2 micron epitaxial layer is formed, the epitaxial layer should be thinned by removing from about 1 to about 1.5 microns while a 1 micron thick epitaxial layer may be thinned an amount ranging from 0 to about 0.5 microns to leave behind, in either case, a thickness of epitaxial silicon over the isolation slot of from about 0.5 to about 1 micron.

Figure 10:
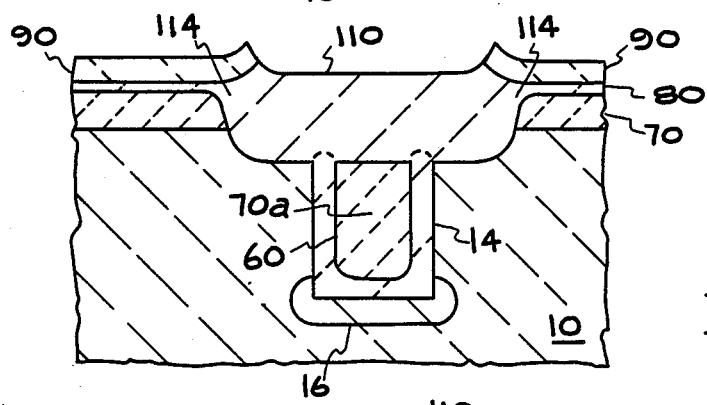
FIG. 10 is a fragmentary vertical cross-section view showing oxidation of the thinned exposed portion of the epitaxial layer of FIG. 9 to form an oxide cap over the isolation slot which extend down to the oxide walls of the slot.

After the thinning step, the structure is exposed to an oxidzing atmosphere until all of the exposed epitaxial silicon has been oxidized to form an oxide cap 110 over slot 14 which extends at least down to the level of oxide 60 on the sidewalls of slot 14, resulting in the structure shown in FIG. 10. This may be done by exposing the structure to an oxidizing medium such as warm steam, for a period of approximately 4–5 hours at about 1000° C., or by using a high pressure oxidation process.

It will be noted in FIG. 10 that oxide cap 110 is shown actually extending down further than the height of oxide layer 60 and slightly into substrate 10 in the exposed area immediately adjacent isolation slot 14 (the original buried layer area prior to diffusion into the epitaxial layer if a buried layer is present). While oxide cap 110 need not actually extend this far into substrate 10, it is important that oxide cap 110 extend down far enough so that oxide cap 110 is contiguous with oxide 60 to provide the desired isolation. A slight over extension of oxide cap downward into substrate 10 will assure the contiguity of oxide cap 110 with oxide 60 without, however, resulting in the creation of stress in the substrate as when prior art oxide is grown in the slot itself to provide the oxide cap.

Furthermore, oxidation of the non-device area of epitaxial layer 70 down to substrate 10, or to the buried layer in the substrate, can have advantages such as reducing the base storage area in lateral PNP devices, resulting in a speed up of the device.

It will also be noted that the growth of oxide cap 110 may result in the formation of "bird's beak" regions 114 of oxide laterally adjacent to oxide cap 110 due to some oxidation of the covered portions of epitaxial layer 70 beneath mask layers 80 and 90, as shown in FIG. 10. Since epitaxial layer 70 is thicker in this area, much of the "bird's beak" regions 114 will extend upwardly of the final upper surface of oxide cap 110. If this "bird's beak" region of oxide is found to be undesirable, this upward extension of oxide 114 lends itself to optional removal of much of the undesirable oxide growth 114 by a simple planarization step in which a planarizing layer of photoresist material may be applied over the surface of oxide cap 110, oxide regions 114 and the remainder of the surface of epitaxial layer 70, after removal of oxide mask layer 80 and nitride mask layer 90, and the surface RIE etched or mechanically polished to remove the oxide regions 114.

Figure 11:
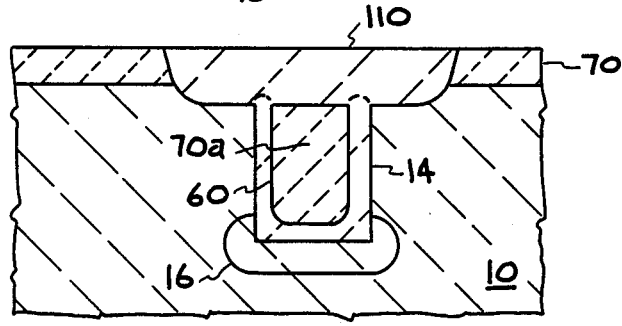
FIG. 11 is a fragmentary vertical cross-section view showing the structure of FIG. 10 after planarization to remove bird's beak regions formed in the epitaxial layer adjacent to the oxide cap.

The result, as shown in FIG. 11, would then be a planarized surface in which the epitaxial layer 70, in or on which active devices may now be formed, is approximately level with the upper surface of oxide cap 110 over filled isolation slot 14.

In any event, the formation of an isolation slot, prior to the formation of the epitaxial layer, in which the oxidized slot is either then refilled with epitaxial silicon up to the level of the epitaxial layer formed during such refilling of the isolation slot, or else covered with the epitaxial layer, followed by local oxidation of the area of the epitaxial layer over the slot down to the level of the oxidized walls of the slot results in the formation of an isolation slot with an oxide cap thereon wherein formation of stresses in the adjacent substrate have been substantially eliminated by virtue of the formation of the oxide cap above the level of the substrate.

Having thus described the invention, what is claimed is:

1. A process for forming an isolation region in a substrate of an integrated circuit structure which comprises:
   (a) forming a first mask over a portion of said substrate where an isolation region is to be formed;
   (b) forming an isolation slot in said substrate through an opening in said mask;
   (c) oxidizing the walls of said slot;
   (d) removing said first mask;
   (e) growing an epitaxial layer over said isolation slot in said substrate;
   (f) forming a second mask over said epitaxial layer with an opening therein over said isolation slot beneath said epitaxial layer of greater dimension than said slot; and
   (g) oxidizing the exposed portion of said epitaxial layer through said opening in said second mask to form an oxide cap over said isolation slot which extends downwardly through said epitaxial layer to said oxide in said isolation slot.

2. The process of claim 1 wherein said step of forming said first mask further comprises the steps of forming an oxide mask layer, forming a nitride mask layer over said oxide layer, and forming a patterned photoresist over said mask layers.

3. The process of claim 2 wherein said steps of forming said first mask further include the step of forming an oxide mask layer over said nitride mask layer.

4. The process of claim 1 wherein said step of forming said isolation slot further comprises etching said substrate through said mask opening to a depth of from about 4 to about 7 microns.

5. The process of claim 1 including the further step of forming a channel stop in said substrate below said isolation slot by doping said substrate through said slot.

6. The process of claim 1 wherein said step of oxidizing the walls of said isolation slot further comprises forming an oxide layer of from about 2000 to about 3000 Å.

7. The process of claim 1 wherein said step of growing said epitaxial layer further comprises growing from about 1 to 2 microns of said epitaxial layer.

8. The process of claim 7 wherein said step of growing said epitaxial layer further comprises growing from about 0.3 to about 0.5 microns of said epitaxial layer with undoped material and then growing the remainder of said epitaxial layer with doped material.

9. The process of claim 1 including the further step of removing a portion of said epitaxial layer exposed by said second mask to thin said epitaxial layer whereby subsequent oxidation of said epitaxial layer will result in oxidation downward to said oxide in said slot and upward to approximately the level of the unexposed portions of said epitaxial layer to form an oxide cap over said isolation slot.

10. The process of claim 1 wherein said substrate comprises silicon and said epitaxial layer grown over said substrate comprises epitaxial silicon.

11. A process for forming an isolation region in a substrate of an integrated circuit structure which comprises:
   (a) forming a first mask over the upper surface of a portion of said substrate where an isolation region is to be formed, comprising the steps of:
      (1) forming an oxide mask layer;
      (2) forming a nitride mask layer over said oxide layer;
      (3) forming an oxide mask layer over said nitride layer; and
      (4) forming a patterned photoresist over said mask layers;
   (b) forming an isolation slot in said substrate through an opening in said mask by etching said substrate through said mask opening to a depth of from about 4 to about 7 microns;
   (c) oxidizing the walls of said isolation slot to form an oxide layer thereon of from about 2000 to about 3000 Å;
   (d) removing said oxide and nitride layers forming said first mask to expose said upper surface of said substrate;
   (e) growing from about 1 to 2 microns of an epitaxial layer over said exposed surface of said substrate and over said isolation slot in said substrate;
   (f) forming a second mask over said epitaxial layer with an opening therein over said isolation slot beneath said epitaxial layer of greater dimension than said slot;
   (g) removing a portion of said epitaxial layer exposed by said second mask to thin said epitaxial layer; and
   (h) oxidizing the remainder of said exposed portion of said epitaxial layer through said opening in said second mask to form an oxide cap over said isolation slot which extends downwardly through said epitaxial layer to said oxide in said isolation slot and upward to approximately the level of the unexposed portions of said epitaxial layer.

12. The process of claim 11 wherein said step of growing said epitaxial layer over said exposed surface of said substrate and over said isolation slot in said substrate further comprises filling said slot with silicon.

13. The process of claim 11 wherein said step of growing said epitaxial layer over said exposed surface of said substrate and over said isolation slot in said substrate further comprises covering said slot with said epitaxial layer.

14. The process of claim 11 including the further step of planarizing said structure after said step of oxidizing said exposed portion of said epitaxial layer to remove raised oxide portions formed in unexposed portions of said epitaxial layer adjacent said portions of said epitaxial layer exposed by said opening in said second mask.

15. The process of claim 11 including the further step of forming a channel stop in said substrate below said isolation slot by doping said substrate through said slot.

16. The process of claim 11 including the further step of removing from said slot substrate material damaged during formation of said slot;

17. The process of claim 16 including the further step of removing oxide from the walls of said slot prior to said step of removing damaged substrate material.

18. The process of claim 11 wherein said step of growing said epitaxial layer further comprises growing from about 0.4 to about 0.5 microns of said epitaxial layer with undoped material and then growing the remainder of said epitaxial layer with doped material.

19. The process of claim 11 wherein said substrate comprises silicon and said epitaxial layer grown over said substrate comprises epitaxial silicon.

20. A process for forming an isolation region in a silicon substrate of an integrated circuit structure which comprises:
   (a) forming a first mask over a portion of said substrate where an isolation region is to be formed, comprising the steps of:
      (1) forming a first oxide mask layer;
      (2) forming a nitride mask layer over said oxide layer;
      (3) forming a second oxide mask layer over said nitride mask layer; and
      (4) forming a patterned photoresist over said mask layers;
   (b) forming an isolation slot in said substrate through an opening in said mask by etching said substrate through said mask opening to a depth of from about 4 to about 7 microns;
   (c) forming a channel stop in said substrate below said isolation slot by doping said substrate through said slot;
   (d) removing said second oxide mask layer;
   (e) oxidizing the walls of said isolation slot to form an oxide layer thereon of from about 2000 to about 3000 Å;
   (f) removing said first oxide and nitride layers forming said first mask;
   (g) growing from about 1 to 2 microns of an epitaxial silicon layer over said isolation slot in said substrate;
   (h) forming a second mask over said epitaxial silicon layer with an opening therein over said isolation slot beneath said epitaxial layer of greater dimension than said slot;
   (g) removing a portion of said epitaxial layer exposed by said second mask to thin said epitaxial layer; and
   (h) oxidizing the remainder of said exposed portion of said epitaxial layer through said opening in said second mask to form an oxide cap over said isolation slot which extends downwardly through said epitaxial layer to said oxide in said isolation slot and upward to approximately the level of the unexposed portions of said epitaxial layer.

21. A process for forming an isolation region in a substrate of an integrated circuit structure which comprises:
   (a) forming a first mask over the upper surface of a portion of said substrate where an isolation region is to be formed;
   (b) forming an isolation slot in said substrate through an opening in said mask;
   (c) oxidizing the walls of said slot;
   (d) removing said first mask to expose the upper surface of said substrate;
   (e) growing an epitaxial layer over said exposed upper surface of said substrate and over said isolation slot in said substrate;
   (f) forming a second mask over said epitaxial layer with an opening therein over said isolation slot beneath said epitaxial layer of greater dimension than said slot; and
   (g) oxidizing the exposed portion of said epitaxial layer through said opening in said second mask to form an oxide cap over said isolation slot which extends downwardly through said epitaxial layer to said oxide in said isolation slot.

* * * * *